United States Patent
Blatchford

(10) Patent No.: US 8,051,391 B2
(45) Date of Patent: Nov. 1, 2011

(54) METHOD FOR LAYOUT OF RANDOM VIA ARRAYS IN THE PRESENCE OF STRONG PITCH RESTRICTIONS

(75) Inventor: James Walter Blatchford, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 458 days.

(21) Appl. No.: 12/185,248

(22) Filed: Aug. 4, 2008

(65) Prior Publication Data

US 2010/0031216 A1    Feb. 4, 2010

(51) Int. Cl.
*G06F 17/50* (2006.01)
*G21K 5/00* (2006.01)
(52) U.S. Cl. ............................................. 716/55; 378/34
(58) Field of Classification Search .......... 716/118–119, 716/122, 124–125, 50–55; 378/34–35
See application file for complete search history.

(56) References Cited

U.S. PATENT DOCUMENTS

| | | | |
|---|---|---|---|
| 2005/0142454 A1* | 6/2005 | Fujimoto et al. | 430/5 |
| 2006/0036977 A1* | 2/2006 | Cohn et al. | 716/4 |
| 2008/0086712 A1* | 4/2008 | Fujimoto | 716/13 |
| 2010/0185997 A1* | 7/2010 | Allen et al. | 716/10 |

* cited by examiner

*Primary Examiner* — Stacy Whitmore
(74) *Attorney, Agent, or Firm* — Warren L. Franz; Wade J. Brady, III; Frederick J. Telecky, Jr.

(57) ABSTRACT

Exemplary embodiments provide a method for laying out an integrated circuit ("IC") design and the IC design layout. In one embodiment, the IC design layout can include a first feature placed on a first intersecting point of a grid. The placed first feature can define a local grid area. The local grid area can further include a plurality of local intersecting points having an outer perimeter spaced from any outermost local intersecting point in a spacing ranging from a length of a grid side to a length of a grid diagonal of a grid unit. A second feature can either be restrictively placed on any local intersecting point of the local grid area, or be randomly placed on any location outside the outer perimeter of the local grid area.

11 Claims, 5 Drawing Sheets

METHOD FOR LAYOUT OF RANDOM VIA ARRAYS IN THE PRESENCE OF STRONG PITCH RESTRICTIONS

FIELD OF THE INVENTION

This invention generally relates to the design of integrated circuit (IC) devices and, more particularly, to IC design layouts for randomly placing features in the presence of strong pitch restrictions.

BACKGROUND OF THE INVENTION

Electronic devices, particularly integrated circuits, include a large number of components fabricated by layering several different materials onto a silicon wafer. In order for the components to function as an electronic device, they are selectively, electrically connected to one another. For example, metal lines are utilized to provide component electrical connection within a layer, while vias connect different metallization and via layers.

When designing an electronic device, a designer creates a circuit description, including electrical connection of the components. The circuit description is input into a computer aided design (CAD) software package running on a computer to form a three-dimensional geometric image of the electronic device, known as a layout.

The layout program generates geometric data using the computer from which a semiconductor chip, circuit board, integrated circuit, or other electronic device is laid out and produced. Generally, a layout includes a set of geometric shapes contained in several layers. In a layout, metal lines are represented as trenches in a layer, and vias are represented as holes in a layer. Typically, the layout is checked to ensure that it meets all of the design requirements, e.g., that there are a sufficient number of vias between a particular upper metal line and a lower metal line to carry the requisite current between the metal lines. Subsequently, a mask that includes the semiconductor circuit layout pattern is imaged onto a substrate that is at least partially covered by a layer of resist using a lithographic projection.

However, there are many problems related to electronic device layouts. A difficult problem relating to via spacing and arrangement arises as electronic device sizes continue to shrink. In the past, an electronic device layout was large enough to accommodate unrestricted via layout. The unrestricted via layout provides a relaxed spacing between neighboring vias, which gives rise to a lower packing density. Today, with electronic device designs, and individual electronic device components such as vias, becoming increasingly smaller and smaller, individual components are required to be spaced closer for a tight packing density.

For example, to resolve minimum spacing between individual components, off-axis illumination with a combination of sub-resolution assist features has been used for 65 nm node hole imaging. When technology advances to 45 nm or less node, very strong off-axis illumination or immersion lithography at higher NA is required. Problems still arise, however, due to insufficient process margin for the manufacturing and the higher cost of the strong off-axis illumination.

Thus, there is a need to overcome these and other problems of the prior art and to provide an IC design layout and the method for laying out the IC design for randomly placing features in the presence of strong pitch restrictions.

SUMMARY OF THE INVENTION

According to various embodiments, the present teachings include a method for laying out an integrated circuit ("IC") design. In this method, a first feature of a semiconductor design can be placed on a first intersecting point of a grid, the grid having a plurality of grid units. A first local grid area can then be determined based on the position of the first intersecting point to include a plurality of local intersecting points having an outer perimeter spaced from an outermost local intersecting point in a spacing ranging from a length of a grid side to a length of a grid diagonal of the grid unit. A second feature can thus be placed on a spot that includes a local intersecting point of the first local grid area and any point of a first pitch unrestricted area covering the area outside the outer perimeter.

According to various embodiments, the present teachings also include an IC design layout. The IC design layout can include a first feature placed on a first intersecting point of a grid, the grid having a plurality of grid units. A first local grid area can then be defined by the first intersecting point to include a plurality of local intersecting points that has an outer perimeter spaced from an outermost local intersecting point by a spacing ranging from a length of a grid side to a length of a grid diagonal of the grid unit. The outer perimeter of the first local grid area can include a plus shape. The IC design layout can also include a second feature placed on a spot that includes a local intersecting point of the first local grid area and any point that is outside the outer perimeter. The area that is outside the outer perimeter is also referred to as a first pitch unrestricted area.

According to various embodiments, the present teachings further include a method for laying out an IC design. A first feature of a semiconductor design can be placed on a first intersecting point of a grid, the grid having a plurality of grid units. Based on the position of the first intersecting point, a first local grid area can be determined to include a plurality of local intersecting points that has an outer perimeter spaced from an outermost local intersecting point by a spacing ranging from a length of a grid side to a length of a grid diagonal of the grid unit. The outer perimeter of the first local grid area can include a plus shape. In this method, a second feature can be placed on a location that includes a local intersecting point of the first local grid area and any point that is outside the outer perimeter. The outside area can be referred to herein as a first pitch unrestricted area.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1:
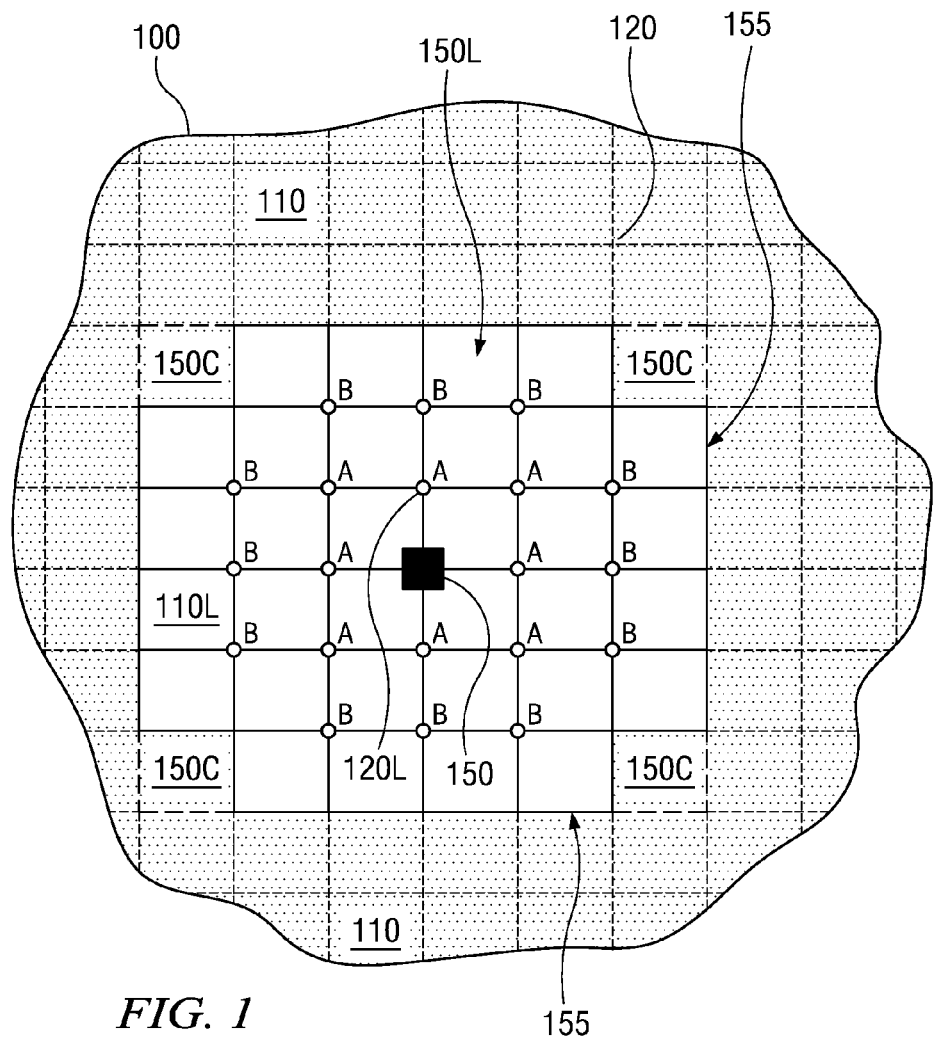
FIG. 1 depicts an exemplary IC design layout and method for laying out the IC design in accordance with the present teachings.

Reference will now be made in detail to the present embodiments (exemplary embodiments) of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Exemplary embodiments provide a method for laying out an integrated circuit ("IC") design and the IC design layout. The IC design layout can include a first feature placed on a first intersecting point of a grid. The placed first feature can define a local grid area or the grid. The local grid area can further include a plurality of local intersecting points having an outer perimeter spaced from any outermost local intersecting point having a spacing ranging from a length of a grid side to a length of a grid diagonal of a grid unit. The local grid area can be a pitch restricted area and the keep-out area of the local grid area (i.e., outside the outer perimeter) can be a pitch unrestricted area. A second feature can either be restrictively placed on a local intersecting point of the pitch restricted area, or be randomly placed on any location of the pitch unrestricted area.

As used herein, the term "design" refers to geometric shapes on a mask layout (i.e., a schematic used to make a semiconductor device) that correspond to mask features formed on a mask, and/or features formed in/on the substrate. The mask layout can be used to form a mask that includes mask features that can be used to endow an incoming beam with a patterned cross-section, corresponding to a target pattern that is to be created in/on a target portion of a substrate.

As used herein, the term "pitch" or "feature pitch" refers to a distance from a centerline of one feature (or structure) to the centerline of an adjoining feature (or structure). As such, pitch can be a relative measure of whether a design is characterized as having isolated features (or structures) or densely populated features (or structures).

FIG. 1 depicts an exemplary method for laying out an IC design in accordance with the present teachings. It should be readily apparent to one of ordinary skill in the art that the IC design depicted in FIG. 1 represents a generalized schematic illustration and that other features/grid units can be added or existing features/grid units can be removed or modified.

As shown in FIG. 1, the design layout can include a grid 100, a first feature 150 and a local grid 150L.

The design layout can start from the grid 100. The grid 100 can include uniformly spaced parallel lines intersecting at an angle, for example, about 90°, and thereby generating a plurality of intersecting points 120 and a plurality of grid units 110. The grid unit 110 can have a shape selected from a group consisting of a square, a rectangle or any other suitable shape. Each grid unit 110 can have grid sides and a grid diagonal, determined by a specific semiconductor design. For example, the grid unit can be a square having a grid side as a targeted minimum pitch $P_{min}$ of an array.

A first feature 150 can be placed on one of the plurality of intersecting points 120, which is also referred to herein as a first intersecting point 120. The position of the first intersecting point 120 can define the local grid area 150L, a portion of the grid 100, based on the feature pitch and the targeted minimum pitch $P_{min}$ of the semiconductor design.

In an exemplary embodiment, the first intersecting point can be located in the center of the local grid area 150L. The local grid area 150L can include a plurality of grid units 110L and a plurality of local intersecting points 120L with an outer perimeter 155 as shown in FIG. 1. The outer perimeter 155 can be spaced away from any outermost local intersecting point of the plurality of local intersecting points 120L by a spacing that ranges from a length of a grid side to a length of a grid diagonal of the corresponding grid unit 110L. The outer perimeter 155, or the local grid area 150L, can thus have a square, a rectangle or any other suitable shape depending on the shape of the plurality of grid units 110L.

In the illustrated embodiment as shown in FIG. 1 where the grid unit 110 is a square, the local grid area 150L can have a plus-shape to keep other grid units out by removing (or clipping) one or more far corners 150C of a squared local grid area in order to increase packing density of the design layout.

In various embodiments, the local grid area 150L can be determined based on specific semiconductor features and their applications. Examples of a semiconductor feature can include a via, a contact hole, a gate, a gate bus, a well, an isolation structure, an interconnect line, a space, a pillar, a resistor, or any other element of a semiconductor device or other device as will be understood by one of ordinary skill in the art. For ease of illustration, the application can be described with reference to a design layout of via arrays.

Figure 2:
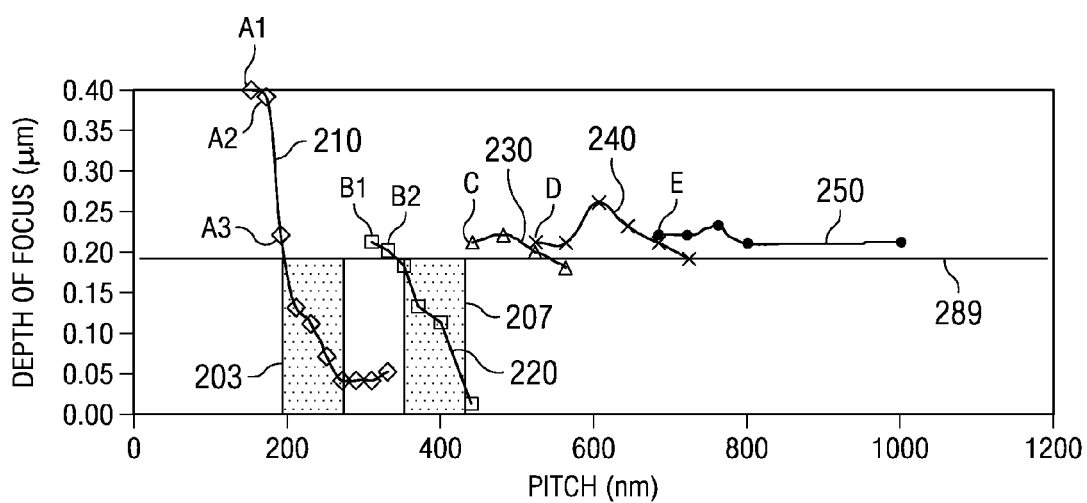
FIG. 2 depicts a mechanism for determining an exemplary local grid area of FIG. 1 in accordance with the present teachings.
Figure 2A:
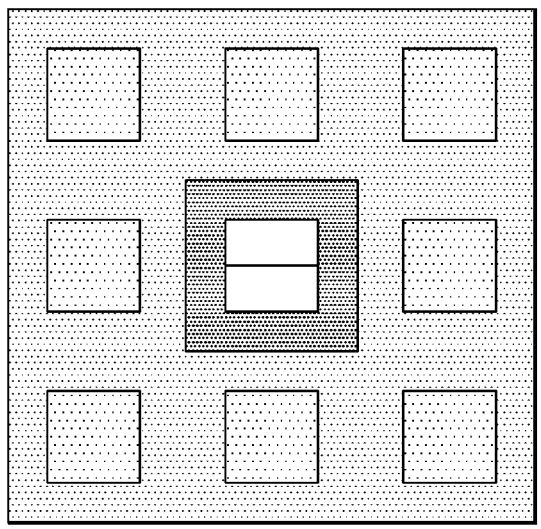
FIGS. 2A-2E depict exemplary patterns having different feature pitches according to FIG. 2 in accordance with the present teachings.
Figure 2B:
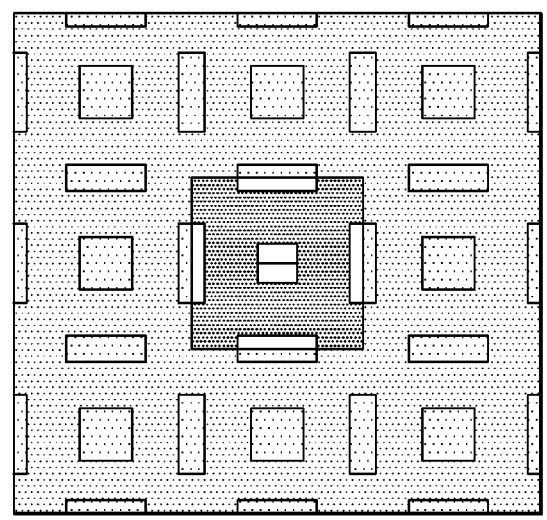
Figure 2C:
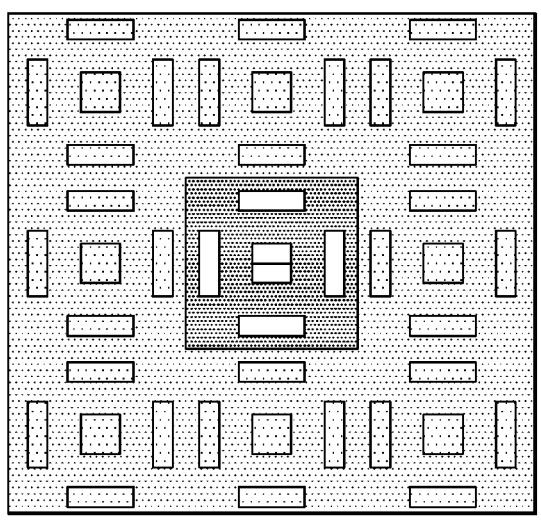
Figure 2D:
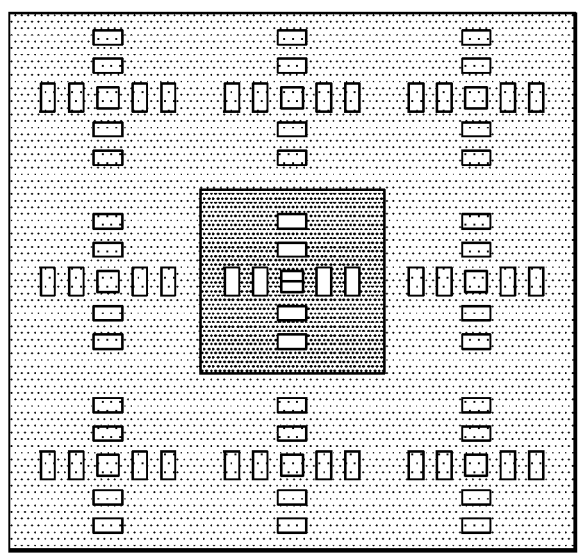
Figure 2E:
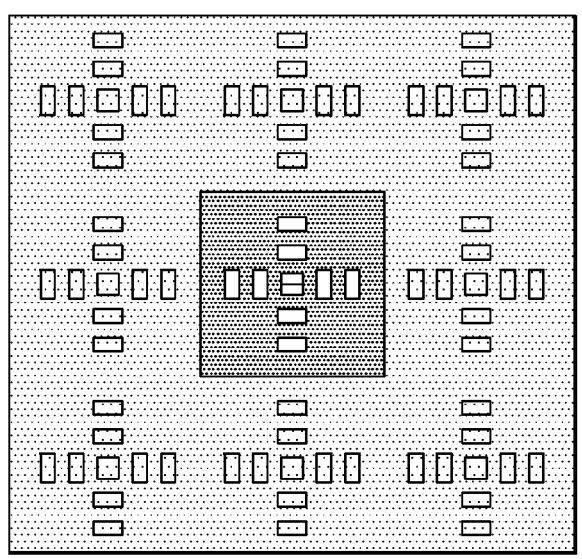

FIG. 2 depicts an exemplary mechanism for determining the shape and dimensions of a local grid area in accordance with the present teachings. Specifically, FIG. 2 shows a relationship of the depth of focus (DoF) from the lithography process with the feature pitch value for an exemplary circuit pattern of via array.

When forming a semiconductor circuit having a via array, a design mask having the design layout of via features can be disposed over a semiconductor substrate (e.g., a "wafer") such that the designed via features on the mask can be reduction-projected onto a resist layer formed on a surface of the wafer using an exposure apparatus for the lithographic process. The depth of focus (DoF) can be a focusing position from which ultraviolet light is irradiated perpendicularly onto the wafer during the exposure process. The depth of focus can be one of factors that determine whether the quality of the resist pattern (formed on the surface of the wafer after exposure and development) is satisfactory or not, especially when the resist pattern is continuingly demanded for a reduction of scale, e.g., for techniques of 45 nm node, 32 nm node or 28 nm node.

Referring back to FIG. 2, the curves 210, 220, 230, 240, and 250 show measured DoF results for different sets of feature pitch values, each set/curve starting from a feature pitch of one targeted minimum pitch $P_{min}$, 2 times of $P_{min}$, 3 times of $P_{min}$, 4 times of $P_{min}$ and 5 times of $P_{min}$, respectively. In addition, FIG. 2 includes a DoF target value 289 showing a targeted focusing position at certain depth of the resist pattern. The focusing position of the measured resist pattern greater than the DoF target can produce satisfactory features (or structures) and the focusing position smaller than the DoF target can produce unsatisfactory features (or structures). The unsatisfactory pitch can be described as a "forbidden pitch". In the "forbidden pitch" area, features placed on the design layout can not produce satisfactory features later on a wafer, for example.

Referring to the curve 210 of FIG. 2, when the feature pitch is around the targeted minimum pitch $P_{min}$ (see point A1, A2, or A3), the measured DoF values can be greater than the DoF target, which generates satisfactory features. When the feature pitch increases, the measured DoF can become smaller than the DoF target and thereby falling into the unsatisfactory forbidden pitch area 203.

Referring to the curve 220 of FIG. 2, when the feature pitch is around 2 times of the targeted minimum pitch $2P_{min}$ (see point B1 or B2), the measured DoF values can be greater than the DoF target, which generates satisfactory features. When the feature pitch increases, the measured DoF can become smaller than the DoF target and thereby falling into the unsatisfactory forbidden pitch area 207.

As shown, the forbidden pitch area 203 can represent an area where the feature pitch value is fallen between the targeted $P_{min}$ and $2P_{min}$, but not including the points around the targeted $P_{min}$ and $2P_{min}$, while the forbidden pitch area 207 can represent an area where the feature pitch value is fallen between $2P_{min}$ and $3P_{min}$, but not including the point around $2P_{min}$ and $3P_{min}$.

Referring to the curve 230, 240, and 250 of FIG. 2, when the feature pitch is around $3P_{min}$ (see point C) or greater, $4P_{min}$ (see point D) or greater, and $5P_{min}$ (see point E) or greater, the measured DoF values can be greater than the DoF target, which generates satisfactory features. In other words, at any pitch that is greater than $3P_{min}$, most of the measured DoFs can be greater than or close to the DoF target and thereby generate satisfactory features. Furthermore, the measured DoFs can be independent of the feature pitch as the feature pitch continues to be increased.

As a result, FIG. 2A, FIG. 2B, FIG. 2C, FIG. 2D, and FIG. 2E depict resist pattern images for the generated features according to FIG. 2, when the feature pitch is selected at multiples of targeted minimum pitch, e.g., around $P_{min}$, $2P_{min}$, $3P_{min}$, $4P_{min}$, and $5P_{min}$ corresponding to the point A1, B1, C, D, and E of the curve 210, 220, 230, 240, and 250, respectively. Note that the images shown have different magnifications. As shown from FIG. 2A to FIG. 2E, when the feature pitch increases, the imaging focus and resolution of the generated resist pattern can be improved.

Consequently, in the illustrated embodiment, when the joining features (e.g., the first and the second features) are less than $3P_{min}$ apart (see the curves 210, and 220), the second feature of the semiconductor design can only be laid out $NP_{min}$—spaced away from the first feature, where N is an integer of 1 or 2 according to the semiconductor design. In addition, when joining features are equal or more than $3P_{min}$ apart (see the curves 230, 240, and 250), satisfactory resist patterns can be formed consistently and any feature pitch of more than $3P_{min}$ can be used to obtain desired resist pattern. In other words, the second feature can be laid out randomly at any spots spaced $3P_{min}$ away from the first feature.

Referring back to FIG. 1, the grid 100 can be used to illustrate the pitch restricted or unrestricted area. For example, the square grid unit 110 can use the targeted minimum pitch $P_{min}$ as a grid side. When the first feature 150, e.g., the first via, is placed on the first intersecting point, each adjacent surrounding intersecting point A can be one $P_{min}$ grid spacing away from the first via 150. And each surrounding intersecting point B can be $2P_{min}$ grid spacing away from the first via 150. In various embodiments, the far corner grid units 150C of the squared grid area that are $3P_{min}$ grid spacing away from the first via 150 can be removed (clipped) to form a plus-shaped local grid area 150L.

In various embodiments, the local grid area that covers the grid-radius of $NP_{min}$ spaced away from the first feature can also be referred to as "the strong pitch restriction area" or "the pitch restricted area" for the design layout. The outside area of the local gird area of the design layout can also referred to as "the pitch unrestricted area".

For example, the second feature can be restrictively placed on the grid intersecting points A and B shown in FIG. 1, in order to obtain a desired resolution of the via pattern. In other embodiments, the second feature can be placed randomly at any location that is out of the local grid area 150L in order to obtain a desired resolution of the via pattern and maximize the packing density.

In various embodiments, the pitch restricted area and the pitch unrestricted area of the design layout can be rearranged for a third feature after the first and the second features have been drawn on the design layout.

Figure 3:
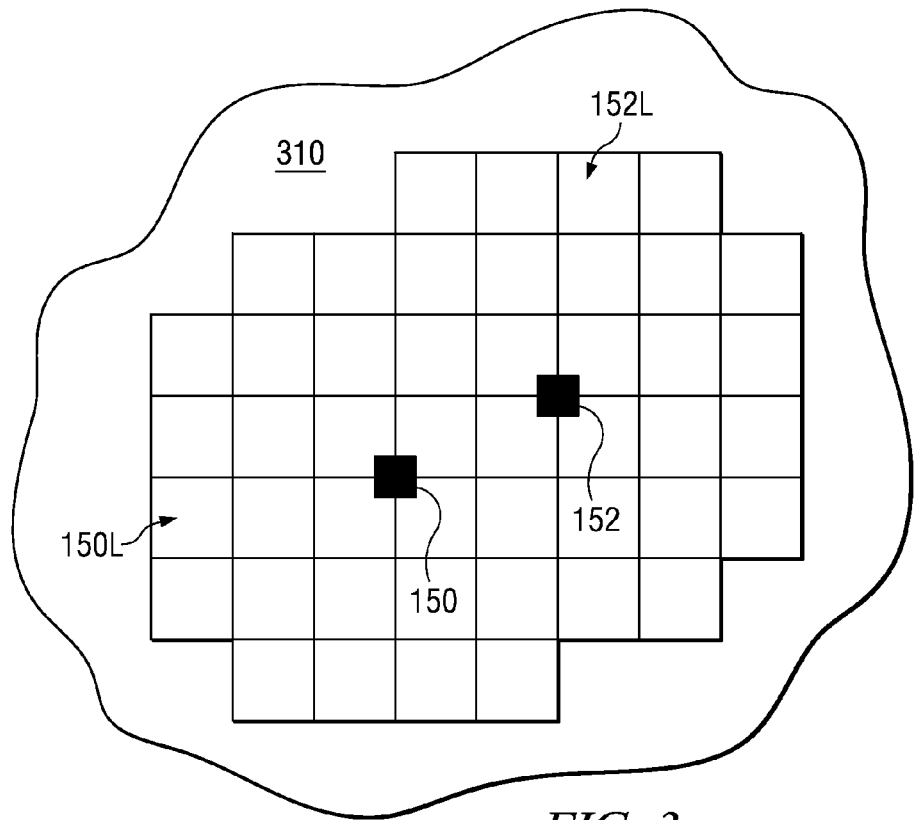
FIG. 3 depicts another exemplary design layout in accordance with the present teachings.

In an exemplary embodiment where the second feature is placed on the restricted local grid area of the first feature, i.e., on one of the intersecting points 120L, the restricted area and the unrestricted area of the design layout can be rearranged as shown in FIG. 3.

FIG. 3 depicts another exemplary design layout having a feature placed restrictively on a pitch restricted local grid area in accordance with the present teachings. As shown, the exemplary second feature 152 can be placed on one of the intersecting points of the restricted local grid area 150L of the first feature 150, although one of ordinary skill in the art can understand that the second feature can also be randomly placed on the unrestricted local grid area. As shown in FIG. 3, the exemplary second feature 152 can be spaced away from the first feature 150 for about $2P_{min}$.

The second feature 152 can then have its own restricted local grid area 152L and unrestricted keep-out area, determined similarly to that for the first feature 150, and also overlapped with the first restricted and unrestricted local grid area of the first feature 150. That is, the gridded area shown in FIG. 3 can represent a combined restricted local grid area. The third feature (not shown) can be placed restrictively on each intersecting point shown in the gridded area of FIG. 3 or can be placed randomly on the keep-out area 310 so as to obtain a desired feature.

Figure 4:
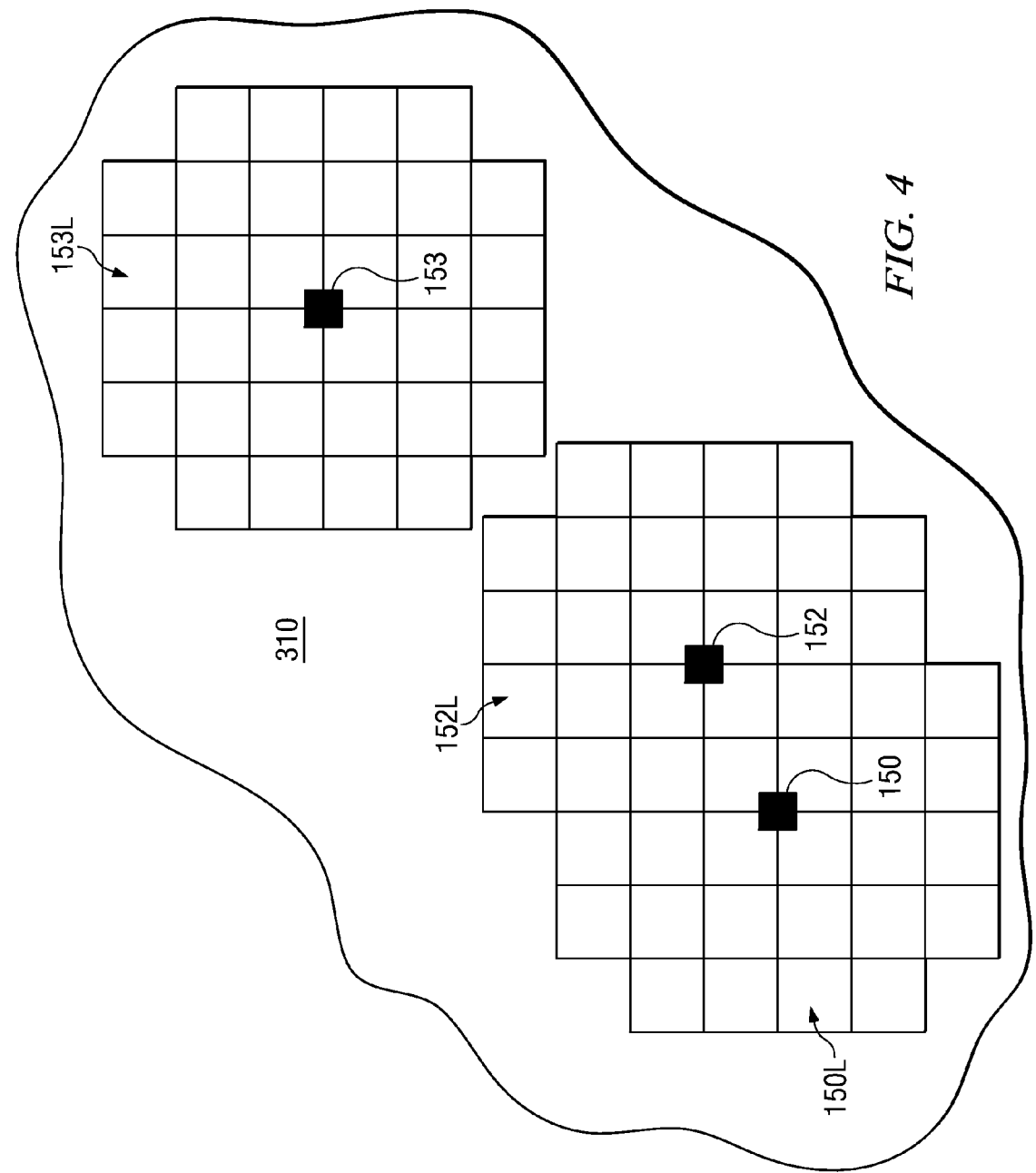
FIG. 4 depicts an additional exemplary design layout in accordance with the present teachings.

In an exemplary embodiment, as shown in FIG. 4, a third feature 153 can be placed on any spot that is in the keep-out area 310 of FIG. 3. In this case, the third feature 153 can have a restricted local grid area 153L having a plurality of interesting points surrounding the third feature 153 and also have an unrestricted keep-out area overlapped with the unrestricted area 310.

The design layout of FIG. 4 can thus have placed three features having a target minimum pitch as shown by the grid side. The three features (150, 152, and 153) can define one or more local grid area where a fourth feature can be placed restrictively on one of the intersecting points. The fourth feature can also be randomly placed on any spot that is kept out of the gridded local area shown in FIG. 4.

Figure 5:
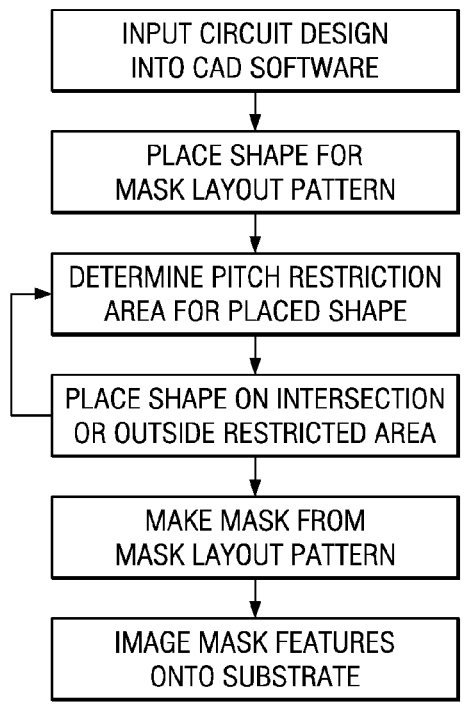
FIG. 5 depicts a flow diagram of a method in accordance with the present teachings.

Exemplary embodiments can further include an IC device and the method for forming the IC device using the disclosed design layout and the design method as described in FIGS. 1-4. For example, a photo-mask can be made (e.g., printed) having one or more mask features directed by the disclosed design layouts. Semiconductor IC features based on the mask features can then be printed and formed on the semiconductor substrate. A flow diagram of a method for forming an IC device is shown in FIG. 5.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming an integrated circuit device, comprising:
    using a layout program running on a computer, generating a mask layout design of geometrical shapes that correspond to target features of a circuit design to be formed in or on a substrate;
    making a mask having mask features corresponding to the mask layout of geometric shapes directed by the layout program; and
    forming features of the integrated circuit device according to the mask features by imaging the mask features by directing a beam through the mask in a lithography process onto a semiconductor substrate that is at least partially covered with a resist;
    wherein generating the mask layout design includes:
        placing a first shape associated with a first target feature at a first location corresponding to a first intersection point of a grid having a plurality of grid units with grid side dimensions defined by a given targeted minimum pitch $P_{min}$ established for the target feature;
        determining a first pitch restriction area within which another feature may be placed only at a location corresponding to an intersection point of a first local area portion of the grid having N×N grid units less four corner units with N>1 and centered on the first intersection point;
        placing a second shape associated with a second target feature at a second location different from the first location, either at any location outside the first pitch restriction area or at any location within the pitch restriction area corresponding to a second intersection point within the first local area portion of the grid.

2. The method of claim 1, wherein the target features are vias or contact holes.

3. The method of claim 1, wherein N=3.

4. The method of claim 1, further comprising:
    determining a second pitch restriction area within which a third feature may be placed only at a location corresponding to an intersection point of a second local area portion having N×N grid units less four corner units with N>1 of a grid having a plurality of grid units with grid side dimensions defined by the given targeted minimum pitch $P_{min}$, and centered on the second intersection point; and
    placing a third shape associated with a third target feature at a third location different from the first and second locations, the third location being either at any location outside both the first and second pitch restriction areas, or at any location corresponding to a common intersection point within both of the first and second pitch restriction areas, or at any location within only one of the first or second pitch restriction areas the or at a location corresponding to an intersection point within only one of the first and second pitch restriction areas.

5. The method of claim 1, further comprising, prior to generating the mask layout design, inputting a circuit design into a computer aided design software package running on the computer to form a three dimensional geometric image layout of the device.

6. A method for forming an integrated circuit device, comprising:
    using a layout program running on a computer, generating a mask layout design of geometrical shapes that correspond to target features of a circuit design to be formed in or on a substrate;
    making a mask having mask features corresponding to the mask layout of geometric shapes directed by the layout program; and
    forming features of the integrated circuit device according to the mask features by imaging the mask features by directing a beam through the mask in a lithography process onto a semiconductor substrate that is at least partially covered with a resist;
    wherein generating the mask layout design includes:
        placing a first shape associated with a first target feature at a first location corresponding to a first intersection point of a grid having a plurality of grid units with grid side dimensions defined by a given targeted minimum pitch $P_{min}$ established for the target feature;
        determining a first pitch restriction area within which another feature may be placed only at a location corresponding to an intersection point of a first local area portion of the grid having N×N grid units less four corner units with N>1 and centered on the first intersection point;
        placing a second shape associated with a second target feature at a second location different from the first location within the pitch restriction area corresponding to any second intersection point within the first local area portion of the grid;

determining a second pitch restriction area within which a third feature may be placed only at a location corresponding to an intersection point of a second local area portion of the grid having the N×N grid units less four corner units and centered on the second intersection point, the second pitch restriction area overlapping the first pitch restriction area; and placing a third shape associated with a third target feature at a third location different from the first and second locations, the third location being either at any location outside of the combined first and second pitch restriction areas, or at any location corresponding to a third intersection point within the combined first and second pitch restriction areas.

7. The method of claim 6, wherein the third shape is placed outside of the combined first and second pitch restriction areas, and further comprising determining a third pitch restriction area within which a fourth feature may be placed only at a location corresponding to an intersection point of a third local area portion having N×N grid units less four corner units with N>1 of a second grid having a plurality of grid units with grid side dimensions defined by the given targeted minimum pitch $P_{min}$, and centered on the third intersection point.

8. The method of claim 7, wherein the target features are vias or contact holes.

9. The method of claim 8, wherein N=3.

10. The method of claim 6, wherein the target features are vias or contact holes.

11. The method of claim 10, wherein N=3.

* * * * *